United States Patent [19]

Garrett et al.

[11] 4,110,133
[45] Aug. 29, 1978

[54] GROWTH OF SEMICONDUCTOR COMPOUNDS BY LIQUID PHASE EPITAXY

[75] Inventors: Ian Garrett, Watford; Michael Rivers Taylor, London, both of England

[73] Assignee: The Post Office, London, England

[21] Appl. No.: 789,714

[22] Filed: Apr. 21, 1977

[30] Foreign Application Priority Data

Apr. 29, 1976 [GB] United Kingdom ............... 17512/76
Sep. 2, 1976 [GB] United Kingdom ............... 36428/76

[51] Int. Cl.² .......................................... H01L 21/208
[52] U.S. Cl. .................................. 148/171; 148/172; 156/622
[58] Field of Search ................ 148/171, 172; 252/62.3 GA; 156/622

[56] References Cited

U.S. PATENT DOCUMENTS

| | | | |
|---|---|---|---|
| 3,631,836 | 1/1972 | Jarvela et al. | 148/171 X |
| 3,664,294 | 5/1972 | Solomon | 148/171 X |
| 3,665,888 | 5/1972 | Bergh et al. | 148/171 X |
| 3,791,887 | 2/1974 | Deitch | 148/172 |
| 3,881,037 | 4/1975 | Grandia et al. | 148/171 X |
| 3,950,195 | 4/1976 | Rode et al. | 148/171 |

*Primary Examiner*—G. Ozaki
*Attorney, Agent, or Firm*—Kemon & Estabrook

[57] ABSTRACT

A method of growing semiconductor compounds which are formed from elements of group III with elements of group V by liquid phase epitaxy. A suitable solvent is provided in contact with a source of the compound to be grown, the solution is heated to a predetermined temperature and the solute is allowed to come to equilibrium with the solvent. The solution is then subjected to a rapid, relatively small decrease in temperature to produce supersaturation of the solution. The temperature is then maintained substantially constant and, after a predetermined first period of time at the constant temperature, the solution is brought into contact with a substrate on which the compound is to be grown for a predetermined second period of time.

5 Claims, 6 Drawing Figures

GROWTH OF SEMICONDUCTOR COMPOUNDS BY LIQUID PHASE EPITAXY

This invention relates to the growth of semiconductor compounds by liquid phase epitaxy. The invention relates particularly to the growth of binary and higher order compounds formed by elements in group III with elements in group V of the periodic table hereinafter referred to as group III-V compounds.

Liquid phase epitaxy is used to grow compounds such as gallium arsenide. In this method a liquid gallium solvent, in which is dissolved gallium arsenide, is placed in contact with a substrate on which a gallium arsenide layer is to be grown. The solution, which initially is at a temperature at which the compound to be grown is appreciably soluble in the solvent. The cooling produces a supersaturation which results in a layer of gallium arsenide being grown on the substrate. All processes which have regularly been used to successfully grow multi layer structures of group III-V compounds by liquid phase epitaxy involve cooling during the actual growth in order to produce the required supersaturation. It is recognised that the thermal parameters selected for the method are important for producing the required thickness and uniformity of the layers. However, there are considerable differences in the manner in which the selection of the thermal parameters is achieved. Some methods use vertical temperature gradients in the solute whilst others use no temperature gradient at all.

We have developed a method of growing semiconductor compounds by liquid phase epitaxy which does not require cooling of the solution during actual growth of the layer. We subject the solution to a single rapid cooling step prior to the growth, the solution then being maintained at a constant uniform temperature throughout the growth of the layer or layers. The single rapid cooling step produces a supersaturation of the solvent and this produces the desired growth.

According to the present invention there is provided a method of growing semiconductor compounds by liquid phase epitaxy which comprises, providing a suitable solvent in contact with a source of the compound to be grown, heating the solution to a predetermined temperature and allowing the solute to come to equilibrium with the solvent, subjecting the solution to a rapid, relatively small decrease in temperature to produce supersaturation of the solution, and, whilst maintaining the temperture substantially constant and after a predetermined first period of time at the constant temperature, bringing the solution into contact with a substrate on which the compound is to be grown for a predetermined second period of time.

The supersaturation produced by the cooling step results in growth of the compound on the substrate. It is possible to evaluate the magnitude of the supersaturation as a function of the time elapsed from the cooling step. By appropriately selecting the degree of supersaturation it is possible to end growth at a time when the rate of growth is relatively small. This means that the error in the thickness of the grown layer can be made relatively small.

When growing gallium arsenide, gallium is used as the solvent, a slice of gallium arsenide being located on top of the gallium to bring about thermodynamic equilibrium of the solution with solid gallium arsenide prior to the cooling step. The method can also be used to grow layers of mixed group III and group V compounds such as gallium aluminium arsenide.

The invention will be described now by way of example only with particular reference to the accompanying drawings. In the drawings.

Figure 1:
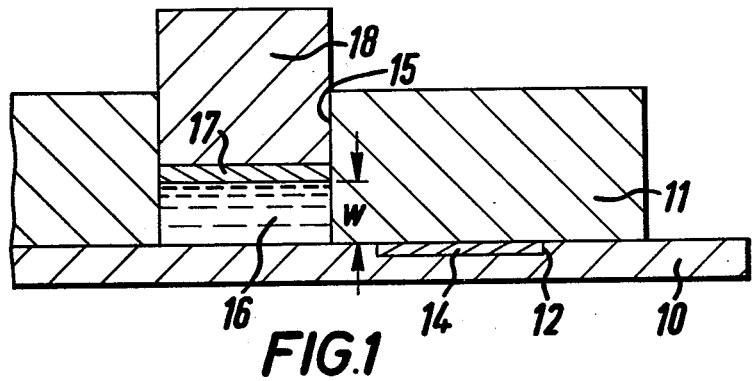
FIG. 1 is a schematic illustration of apparatus which can be used to carry out the method of the present invention.

Referring to FIG. 1 apparatus for carrying out the present method has a graphite base 10 on which is mounted a graphite slider 11. The graphite slider 11 is slidable along the base 10. The graphite base 10 has a recess 12 in which is located a substrate 14 of gallium arsenide. The graphite slider 11 has an opening 15 which constitutes a compartment for liquid gallium 16. A slice 17 of gallium arsenide is arranged on the upper surface of the liquid gallium so that the liquid gallium is saturated with gallium arsenide. The slice 17 and liquid gallium solution 16 are pressed down by a weight 18 of graphite or other material.

The apparatus is mounted in a silica tube (not shown) through which is passed a suitably dry and pure flow of hydrogen, and the whole is heated in a suitable furnace (not shown) which provides a uniform temperature over an axial distance rather greater than the length of the graphite boat. This type of apparatus is commonly used in growing semiconductor compounds by liquid phase epitaxy and will not be described in any further detail here.

In use the gallium solvent is heated to a temperature of about 840° C. and allowed to come into thermodynamic equilibrium with the uppermost gallium arsenide slice. After the liquid gallium and the gallium arsenide have come into thermodynamic equilibrium they are subjected to a rapid relatively small decrease in temperature of typically a few degrees, the result being that the majority of the solution becomes supersaturated with gallium arsenide, the supersaturation dropping to zero at the solid gallium arsenide surface. It is possible to produce the rapid cooling as the thermal diffusivity of liquid gallium is several orders of magnitude larger than the diffusivity of the gallium arsenide solute.

A predetermined time after the cooling step the graphite slider is moved along the base 10 so that the solution 16 is above the substrate. The supersaturation results in deposition of gallium arsenide on the gallium arsenide substrate. The magnitude of the supersaturation of the solution can be calculated as a function of time and on the basis of this calculation it is possible to determine the period of time for which the solution must be left over the substrate in order to produce a given thickness of gallium arsenide. At the end of this calculated period the slider is moved along the base so that the solution is moved out of contact with the substrate and growth is ended. If more than one layer is to be grown a graphite slider with a number of compartments is used. Each compartment contains a solute and material to be dissolved in the solute appropriate to a particular layer which is to be grown.

By using well known diffusion analysis techniques it is possible to evaluate the profile of excess solute in the gallium arsenide - gallium solution as a function of distance from the bottom of the solution after the cooling step has been performed. This analysis will now be given in outline.

The concentration $f(x,t)$ of excess solute in the solution obeys the diffusion equation $$\frac{\delta f}{\delta t} = D \frac{\delta^2 f}{\delta x^2}$$

where D is the diffusion coefficient and $x$ the distance from the bottom of the solution. If the depth of the solution is $w$ $$f = 0 \text{ at } x = w$$

$$\frac{\delta f}{\delta x} = 0 \text{ at } x = 0$$

The solution to the diffusion equation is $$\frac{f(x,t)}{f_o} = \frac{4}{\pi} \sum_{n=0}^{\infty} \frac{(-1)^n}{(2n+1)} \cos(2n+1) \frac{\pi x}{2w} e^{-(2n+1)^2 t/\tau} \quad (1)$$

where $\tau$ is the diffusion relaxation time and $f_o$ is the supersaturation $f(x,0)$ corresponding to the temperature drop $\Delta T$ of the cooling step.

Figure 2:
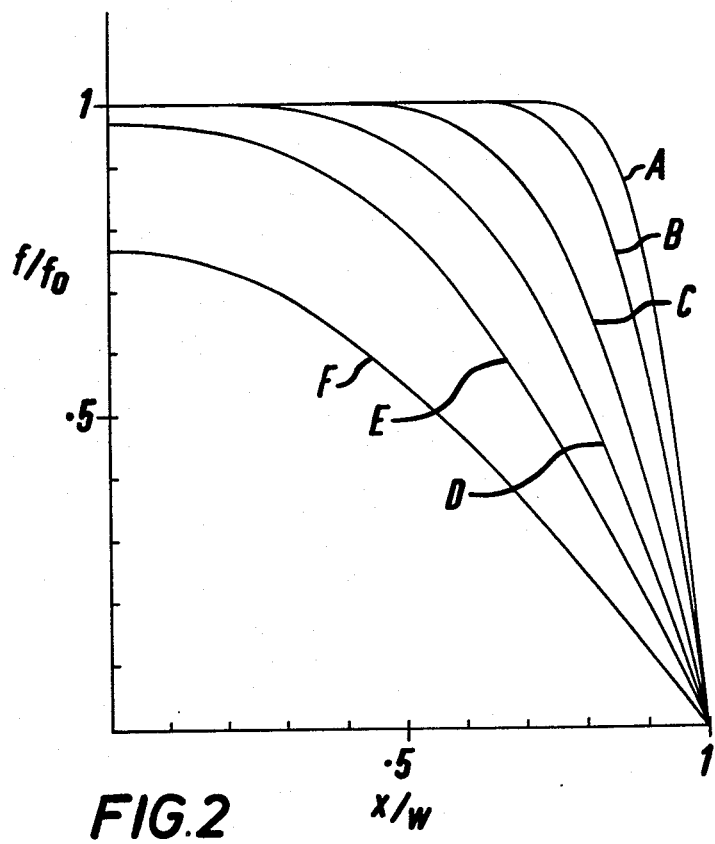
FIG. 2 is a plot showing excess solute concentration as a function of depth in the solution at a number of instants after cooling of the solution.

The solution to equation (1) is shown graphically in FIG. 2 for $w = 0.2$cm and $\tau = 400$sec. The ordinate represents the excess solute concentration and the abscissa represents the distance from the bottom of the solution. Curve A applies to a time immediately after the cooling step, curve B to a short time later and so on up to curve F.

The excess solute concentration at $x = 0$, which is the overpotential for growth when the solution and substrate are brought into contact, is given by:

$$\frac{f(0,t)}{f_o} = \frac{4}{\pi} \left[ e^{-t/\tau} - \frac{1}{3} e^{-9t/\tau} + \frac{1}{5} e^{-25t/\tau} \right] \quad (2)$$

For $t/\tau \geq 1/3$ $$\frac{f(0,t)}{f_o} \simeq \frac{4}{\pi} e^{-t/\tau} \quad (3)$$

Figure 3:
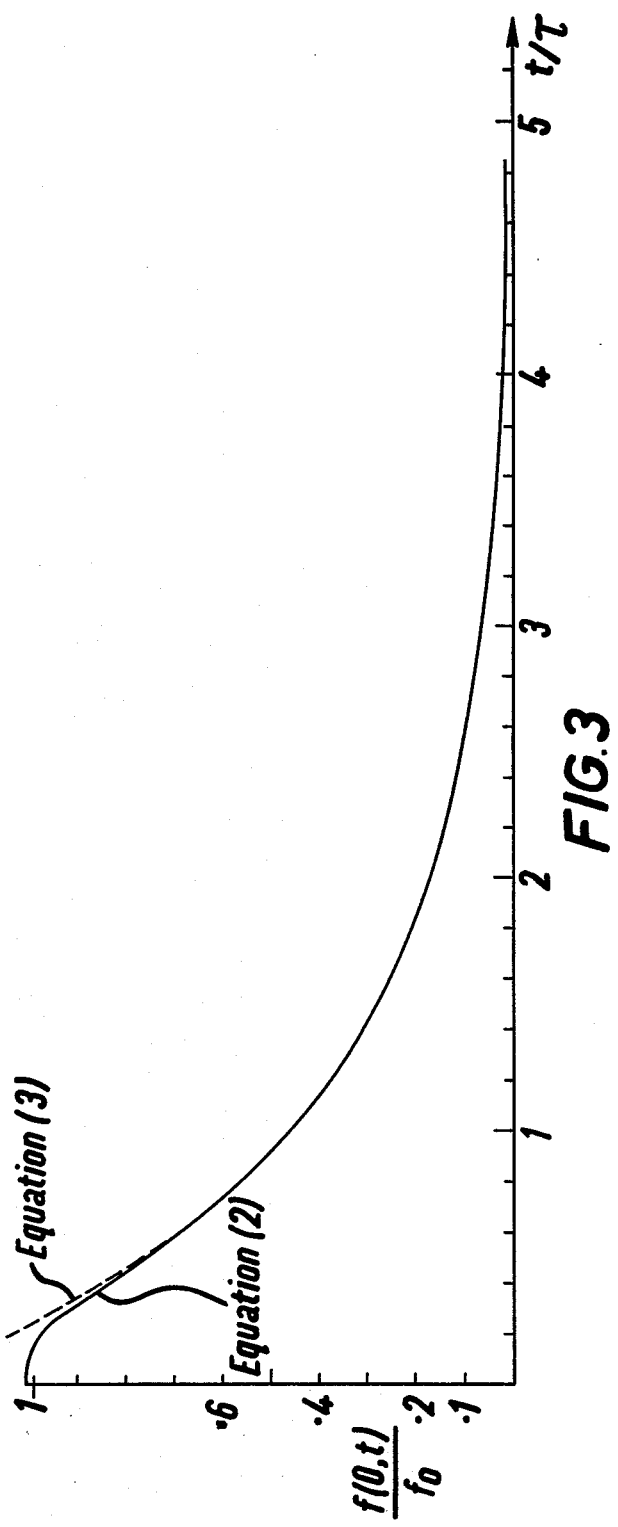
FIG. 3 is a curve showing the variation of supersaturation as a function of time after cooling.

The solution to equation (2) and (3) is shown in FIG. 3 in which the ordinate represents the supersaturation and the abscissa the time. It should be noted that this applies to the situation before the solution has been brought into contact with the substrate. It will be seen that having evaluated the curve of FIG. 3 it is possible to estimate the supersaturation at any given time after the cooling step.

At some time $t_g$ after the cooling step the solution is brought into contact with the substrate. At this time the gallium arsenide solution is deposited on the gallium arsenide at the base of the solution as well as at the top thereof. Thus $$f = 0 \text{ at } x = 0 \text{ and at } x = w$$

The solution to the diffusion equation is now:

$$\frac{f(x,t')}{f_o} = \sum_{n=1}^{\infty} B_n \sin \frac{n\pi x}{w} e^{-n^2 t'/\tau'}$$

where $t' = t - t_g$, $\tau' = \tau/4$ is the diffusion relaxation time under the new conditions, $f_o$ is the excess solute concentration at $x = 0$ immediately before $t_g$ and $B_n$ is given by $$B_n = \frac{2}{w} \int_0^w \frac{f(s,0)}{f_o} \sin \frac{n\pi s}{w} ds$$

The distribution of excess solute after time $t_g$ can thus be evaluated. Now when $t \geq \tau/3$ the concentration of excess solute is approximately represented by the first term of equation (1). Thus for $t_g \geq \tau/3$ $$B_n = \frac{8}{\pi w} \int_0^w e^{-t_g/\tau} \left( \cos \frac{\pi s}{2w} \sin \frac{n\pi s}{w} \right) ds \text{ and} \quad (4)$$

$$\frac{f(x,t')}{f_o} = \frac{32}{\pi^2} e^{-t_g/\tau} \sum_{n=1}^{\infty} \frac{n}{(4n^2-1)} \sin\left(\frac{n\pi x}{w}\right) e^{-\frac{n^2 t'}{\tau'}}$$

Figure 4:
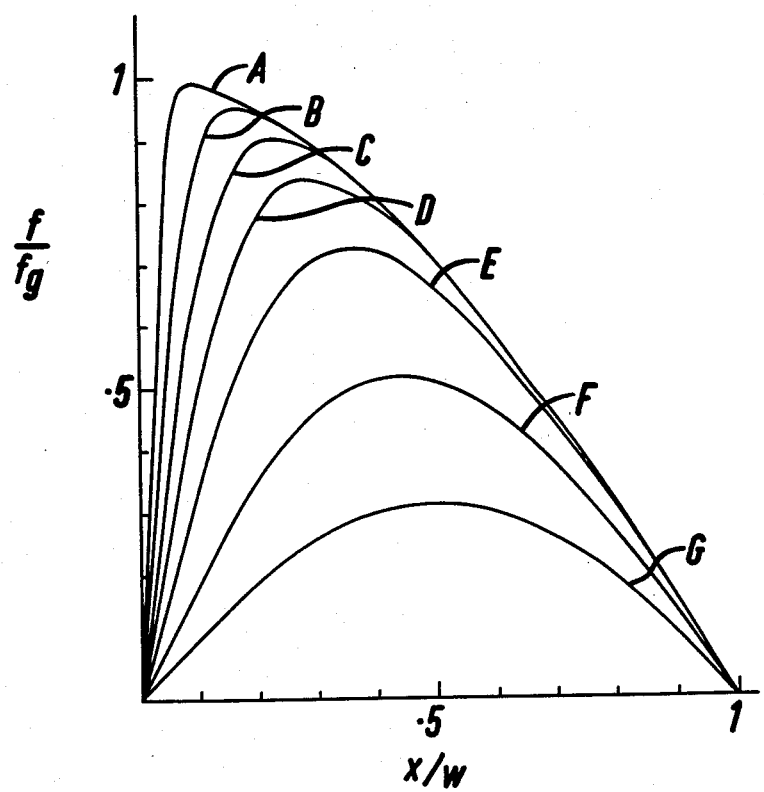
FIG. 4 is a plot showing excess solute concentration as a function of depth in the solution at a number of instants after the solution has contracted a substrate.

The distribution of excess solute is shown in FIG. 4. In this Figure curve A applies to a time immediately after the solute is brought into contact with the substrate, curve B to a short time later and so on.

The rate of growth J of the layer of gallium arsenide is equal to the flux of matter at the base of the solution and can be evaluated from Fick's Law:

$$J = D \left( \frac{\delta f}{\delta x} \right)_{x=0}$$

Differentiating equation (4) gives $$J = -32 f_o w e^{-t_g/\tau} \sum_{n=1}^{\infty} \frac{n^2}{(4n^2-1)} e^{-n^2 t'/\tau'}$$

The thickness of the grown layer is given by $$d(t') = \frac{M}{\rho} \int_0^{t'} J \, dt$$

where M is the molecular weight and the density of GaAs. From equation (4)

$$d(t) = \frac{-32M}{\pi^3 \rho} f_o w e^{-t_g/\tau} \sum_{n=1}^{\infty} \frac{1}{(4n^2-1)} \{e^{-n^2 t'/\tau'} - 1\}$$

After a long time when all excess solute has been removed the maximum thickness is $$d \max = \frac{16M}{\pi^3 \rho} f_o w e^{-t_g/\tau}$$

Figure 5:
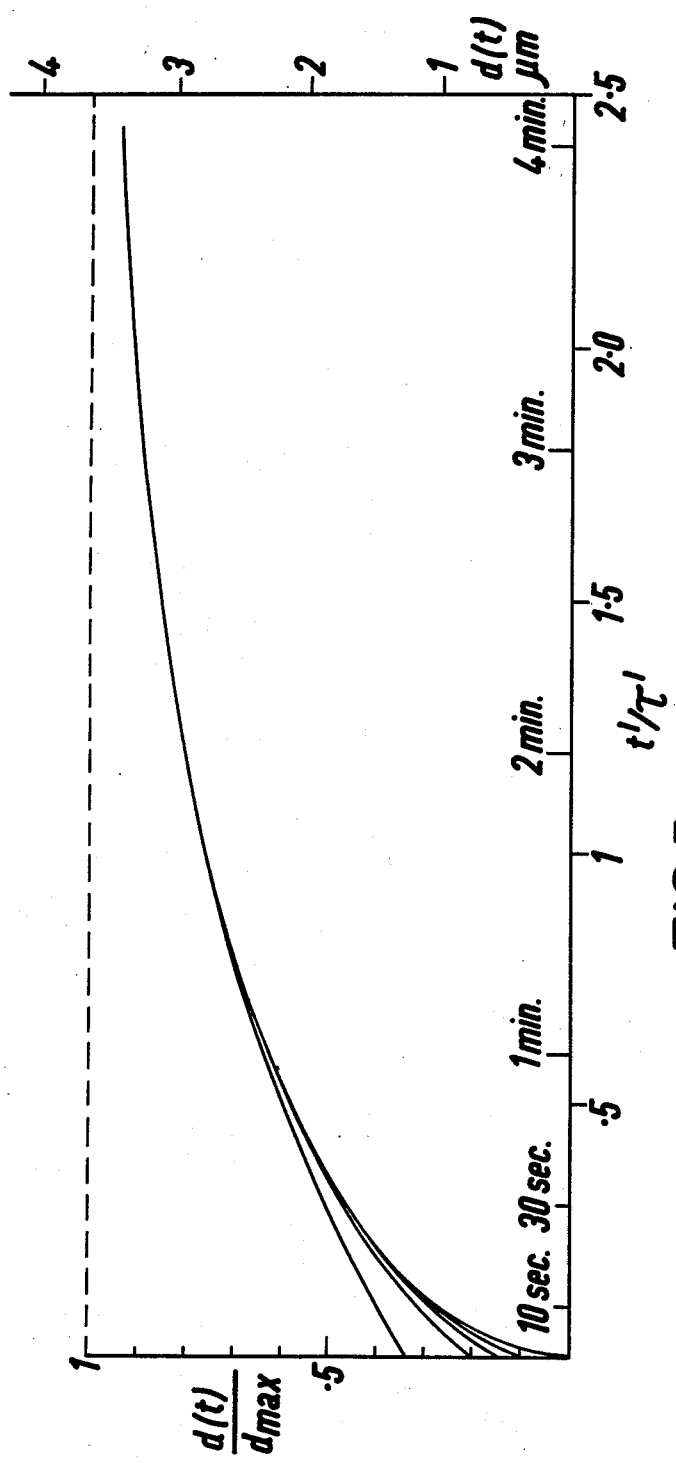
FIG. 5 is a curve showing the variation of thickness of layer with time of growth.

The thickness of the layer being grown is plotted against time in FIG. 5. Using the information expressed by this curve it is possible to stop growth when the required thickness of gallium arsenide has been grown.

The thickness of a layer grown in a given time is governed by the following factors.

1. The decrease in temperature at the cooling step. The smallest decrease in temperature which can be used is fixed by temperature fluctuations within the furnace and is probably of the order of 0.5° K. The maximum value of the decrease in temperature is that at which significant nucleation takes place within the solution during the growth experiment and is probably around 5° K.

2. The thickness $w$ of the solute

3. The time between the cooling step and the bringing into contact of the solution with the substrate.

4. The temperature at which the furnace is operated.

We have found that the present method can be used to grow a relatively large range of single layer thicknesses. Experiment shows good agreement between the thicknesses of the layers grown and the theoretical analysis given above. Furthermore multi-layer structures with layers differing in thickness by an order of magnitude or more may be grown by suitable selection of the growth parameters already mentioned.

Figure 6:
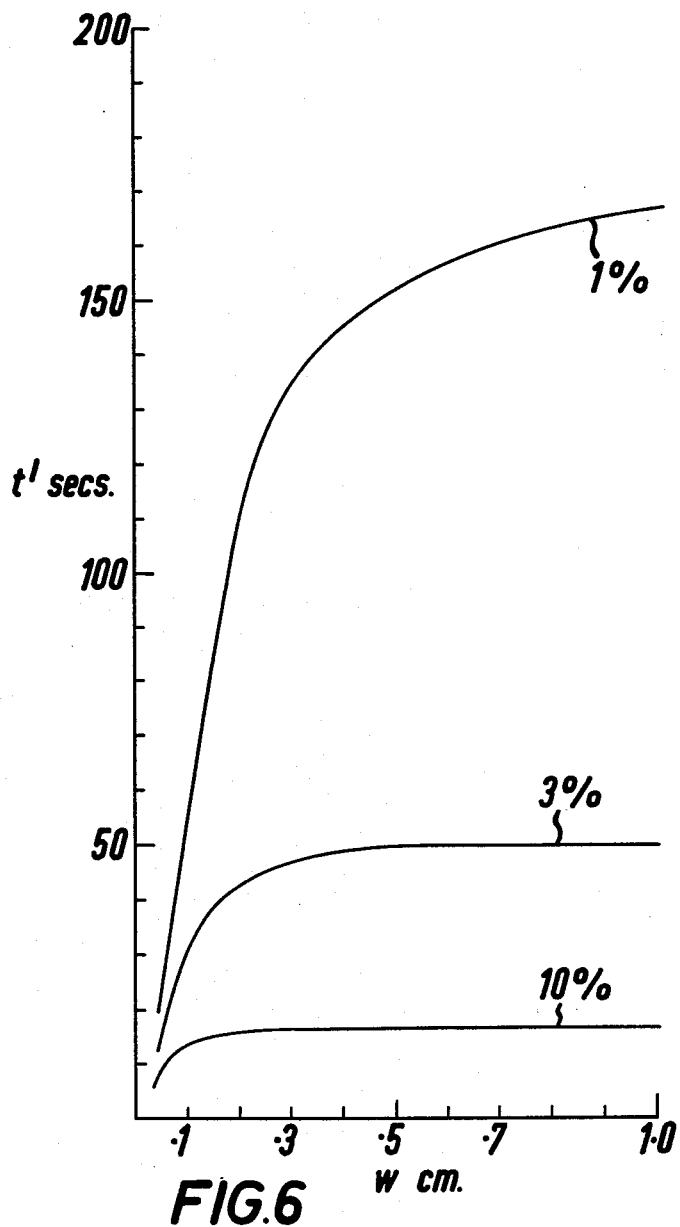
FIG. 6 shows the variation of growth time as a function of solution depth for different errors of layer thickness.

From a practical point of view it is desirable that growth of the layer is ended at a time when the growth rate is relatively small. Thus referring to FIG. 5 it is advantageous if the growth can be ended at a time when the curve is approaching the maximum layer thickness which can be grown. At this point on the curve it is not very critical at exactly which time growth ceases. It is possible to evaluate growth time as a function of solution depth for different errors in layer thickness. This information is plotted in FIG. 6 for three errors in layer thickness of 1, 3 and 10%. In order to obtain control to better than 3% in layer thickness it is necessary to operate at a point above the middle line. This therefore requires growth times of 50 seconds for solution of 3mm and deeper or 32 seconds for solution of 1mm depth. It is not difficult to arrange such conditions in practice.

It should be noted that in practice it is not possible to achieve an ideal, substantially instantaneous, cooling step. It may be necessary, therefore, to apply a correction for a finite cooling period.

The method can be applied to the growth of layers which require a solution containing two or more solutes. An example is an alloy of two compounds of group III and group V, such as gallium aluminum arsenide. In the case of gallium aluminum arsenide the solvent is liquid gallium containing aluminum and the slice on the upper surface of the liquid gallium is gallium arsenide. The general analysis of such a system must be carried out numerically, because the boundary conditions at the interfaces between the solid and the solution vary with time in a way determined by the relevant isotherms on the phase diagram for the system. However, if the solutes are present in small concentrations, and if they all have substantially the same diffusivity in the solvent, the analysis is exactly parallel to the simple diffusion analysis used here, since each solute varies in concentration in a geometrically similar way, and the boundary conditions are constant in time. If the solutes have different diffusivities, it can be shown theoretically that in certain cases the resulting change in layer composition will be extremely small.

We have found that the experimental rates of growth are in good agreement with predicted rates. This method of growing gallium aluminum arsenide produces a layer which has a substantially uniform composition throughout its thickness.

We claim:

1. A method of growing a semiconductor compound by liquid phase epitaxy which comprises:
    (a) providing a suitable solvent and providing a source of a compound to be grown in contact with the upper surface of the solvent;
    (b) heating the solvent and the source of the compound to a predetermined first temperature and allowing the solute to form a solution and to come to equilibrium with the solvent;
    (c) subjecting the solution formed in (b) to a rapid relatively small decrease in temperature to a second temperature to produce a supersaturated solution;
    (d) keeping the source of the compound in contact with the thus-supersaturated solution and maintaining the temperature substantially constant for a predetermined first period of time at the second temperature; and
    (e) bringing the solution with the source in contact with the upper surface thereof into contact with a substrate on which the compound is to be grown for a predetermined second period of time at the second temperature.

2. A method as claimed in claim 1 including evaluating the first and second periods of time by conventional diffusion analysis techniques.

3. A method as claimed in claim 1 wherein the growth is arranged to end when the rate of growth is relatively small.

4. A method as claimed in claim 1, wherein the semiconductor compound is gallium arsenide, the solvent is gallium and the source of the compound to be grown is gallium arsenide.

5. A method as claimed in claim 1, wherein the semiconductor compound is gallium aluminum arsenide, the solvent is gallium containing aluminum, and the source of the compound to be grown is gallium arsenide.

* * * * *